(12) United States Patent
Nair et al.

(10) Patent No.: US 6,529,398 B1
(45) Date of Patent: Mar. 4, 2003

(54) FERROELECTRIC MEMORY AND METHOD FOR READING THE SAME

(75) Inventors: Rajendran Nair, Gilbert, AZ (US); David G. Chow, Los Altos, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/967,495

(22) Filed: Sep. 27, 2001

(51) Int. Cl.[7] .............................................. G11C 11/12
(52) U.S. Cl. .................. 365/145; 365/189.09; 365/149
(58) Field of Search ................. 365/145, 207, 365/196, 210, 149, 117, 189.09

(56) References Cited

U.S. PATENT DOCUMENTS 5,274,583 A * 12/1993 Rapp ........................... 365/145
5,768,180 A * 6/1998 Pohm .......................... 365/158

* cited by examiner

*Primary Examiner*—David Nelms
*Assistant Examiner*—Thong Le
(74) *Attorney, Agent, or Firm*—Marger Johnson & McCollom, PC

(57) ABSTRACT

A ferroelectric memory device and method for reading such a device utilize capacitive coupling between a reference circuit and a sense amplifier. The amount of sneak charge canceled from a data bit line depends on the relative capacitances of a coupling capacitor and another capacitor used to integrate sneak charge from a reference bit line. The use of linear-responding components improves stability.

22 Claims, 4 Drawing Sheets

FERROELECTRIC MEMORY AND METHOD FOR READING THE SAME

BACKGROUND OF THE INVENTION

The present invention relates generally to electronic memory and, more particularly, to a ferroelectric memory device and a method of reading such a device.

Ferroelectric memory is a type of nonvolatile memory that utilizes the ferroelectric behavior of certain materials to retain data in a memory device in the form of positive and negative polarization, even in the absence of electric power. A ferroelectric material contains domains of similarly oriented electric dipoles that retain their orientation unless disturbed by some externally imposed electric force. The polarization of the material characterizes the extent to which these domains are aligned. The polarization can be reversed by the application of an electric field of sufficient strength and polarity.

FIG. 1 illustrates a prior art ferroelectric cell 10 in a ferroelectric memory array. A ferroelectric material 16 having a polarization P is sandwiched between a conductive word line 20 and a conductive bit line 22. An electric field may be applied to the ferroelectric cell by applying an electric potential (voltage) between the word line and the bit line so as to effect changes in the polarization of the ferroelectric material.

When a positive voltage of sufficiently large magnitude is applied to the cell, all of the domains in the cell are forced to align, to the extent possible, in the positive direction. If the voltage is then reduced to zero, some of the domains switch their orientation (also referred to as rotating, flipping or reversing), but most of the domains retain their orientation. Thus, the ferroelectric material retains a remnant polarization in the positive direction.

If a negative voltage of sufficiently large magnitude is then applied to the word line relative to bit line, all of the domains are forced to switch their orientation. Removing this negative voltage allows some of the domains to switch, but the cell polarization retains a remnant polarization in the negative direction until it is disturbed again.

For purposes of data storage, the ferroelectric cell 10 is considered to be in the logic "0" (zero) state when the polarization is positive, and the logic "1" (one) state when the polarization is negative.

A certain amount of charge is required to switch the polarity of a domain. This charge release provides the fundamental principle for a "destructive" read of a ferroelectric cell. For example, the state of a cell can be read by observing the charge released from the cell while applying a positive voltage sufficient to switch the polarization of the cell. A large charge release indicates that the cell was a logic one, whereas little or no charge release indicates that the cell was a logic zero. The cell ends up in the zero state, regardless of its state before the read operation. Thus, a cell that was in the one state must then be rewritten as a one if further data retention is required.

DETAILED DESCRIPTION

Figure 1:
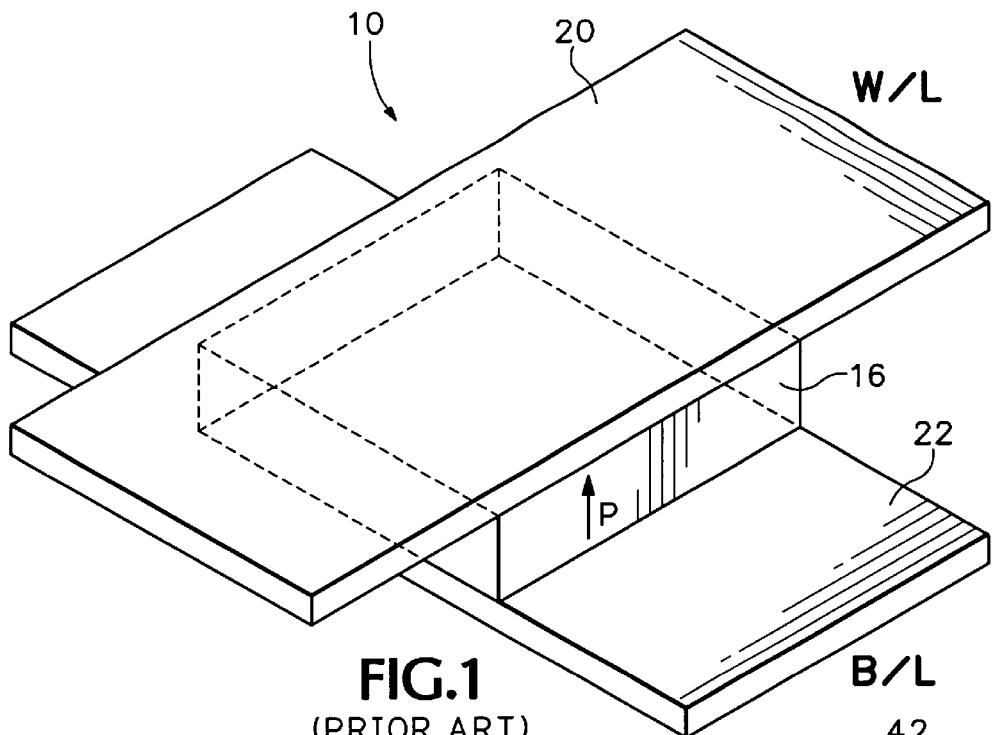
FIG. 1 illustrates a prior art ferroelectric cell in a ferroelectric memory array.
Figure 2:
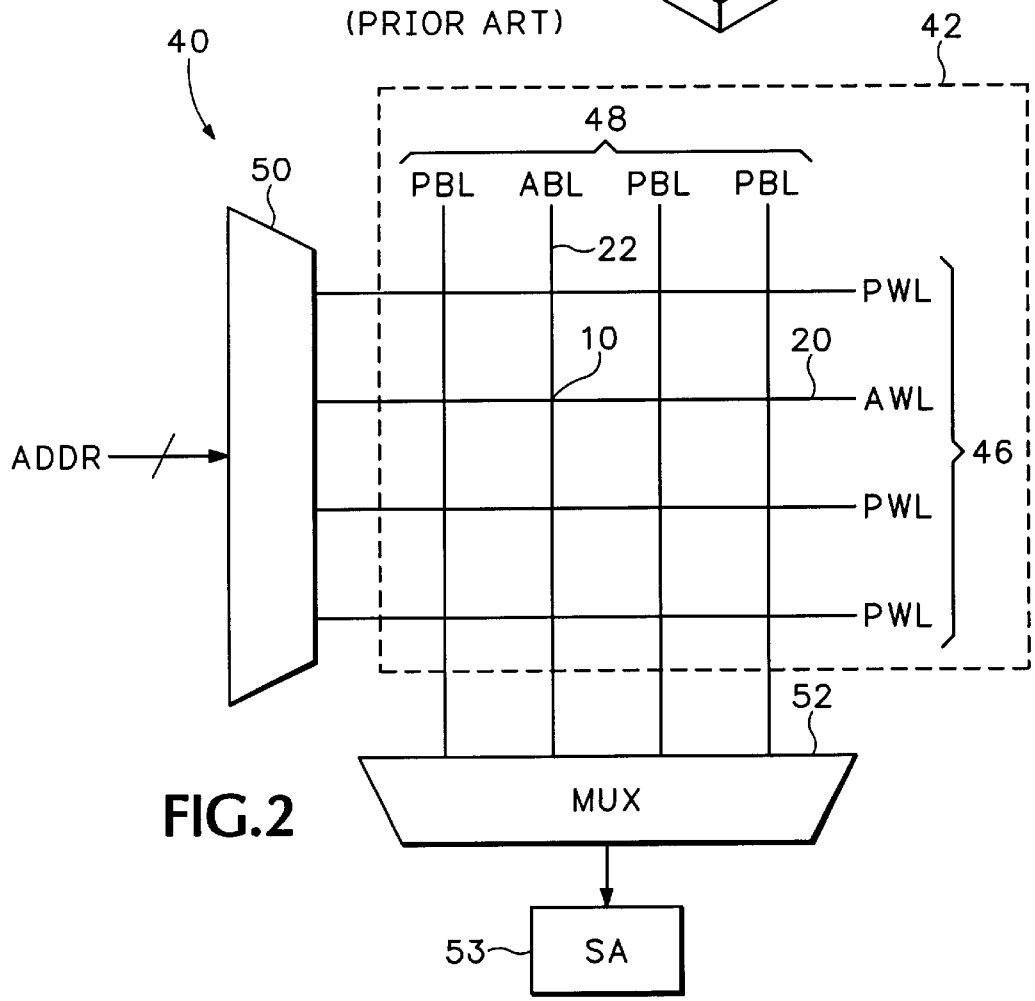
FIG. 2 is a block diagram of a ferroelectric memory device for an exemplary embodiment of the present invention.

FIG. 2 illustrates simplistically a ferroelectric memory device 40 for an exemplary embodiment of the present invention. Memory device 40 includes a cross-point passive matrix memory array 42 having word lines 46 that cross bit lines 48. Ferroelectric material is disposed between the word lines and bit lines to form ferroelectric cells at the intersections of word lines and bit lines. For example, a ferroelectric cell 10, such as that shown in FIG. 1, is located at the crossing of the word line identified as 20 and the bit line identified as 22 in FIG. 2. In this example, cell 10 is referred to as "active" because it identifies a specific cell that has been selected to read. The word line coupled to the active cell is identified as an active word line (AWL), whereas the remaining word lines are passive word lines (PWL). Likewise, the bit line coupled to the active cell is identified as the active bit line (ABL), whereas the remaining bit lines are passive bit lines (PBL).

When reading an active cell, a read or switching level voltage ($V_s$) is applied to the active word line 20. The read level voltage has a magnitude that is defined relative to the active bit line 22, and is sufficient to effect a polarization reversal of the active cell 10. Thus, the active cell is destructively read, wherein application of the read level voltage may switch the cell's polarization state. To restore the stored data after a polarization reversal, the data is written back into the active cell in a known fashion.

During the read, the passive bit lines and passive word lines are driven with voltages that provide quiescent level electric fields across the passive ferroelectric cells. Quiescent level voltages may temporarily disturb the ferroelectric cell, but are not strong enough to switch the polarization of the cell. For example, a quiescent voltage level having a magnitude no greater than ⅓ the switching level voltage will typically not be enough to reverse the cell polarization.

Referring again to FIG. 2, the word lines 46 are driven by a row decoder 50 that selects which of the word lines to drive as an active word line and which to drive as passive word lines in response to row address information. In the embodiment of FIG. 2, the bit lines 48 are selectively coupled to a sense amplifier (also referred to as a "sense amp") 53 through a multiplexer 52, but other arrangements may be used. For example, in another embodiment, each bit line could be coupled to a separate sense amplifier, thereby eliminating the multiplexer. The entire device 40 is typically fabricated on a single integrated circuit.

Figure 3:
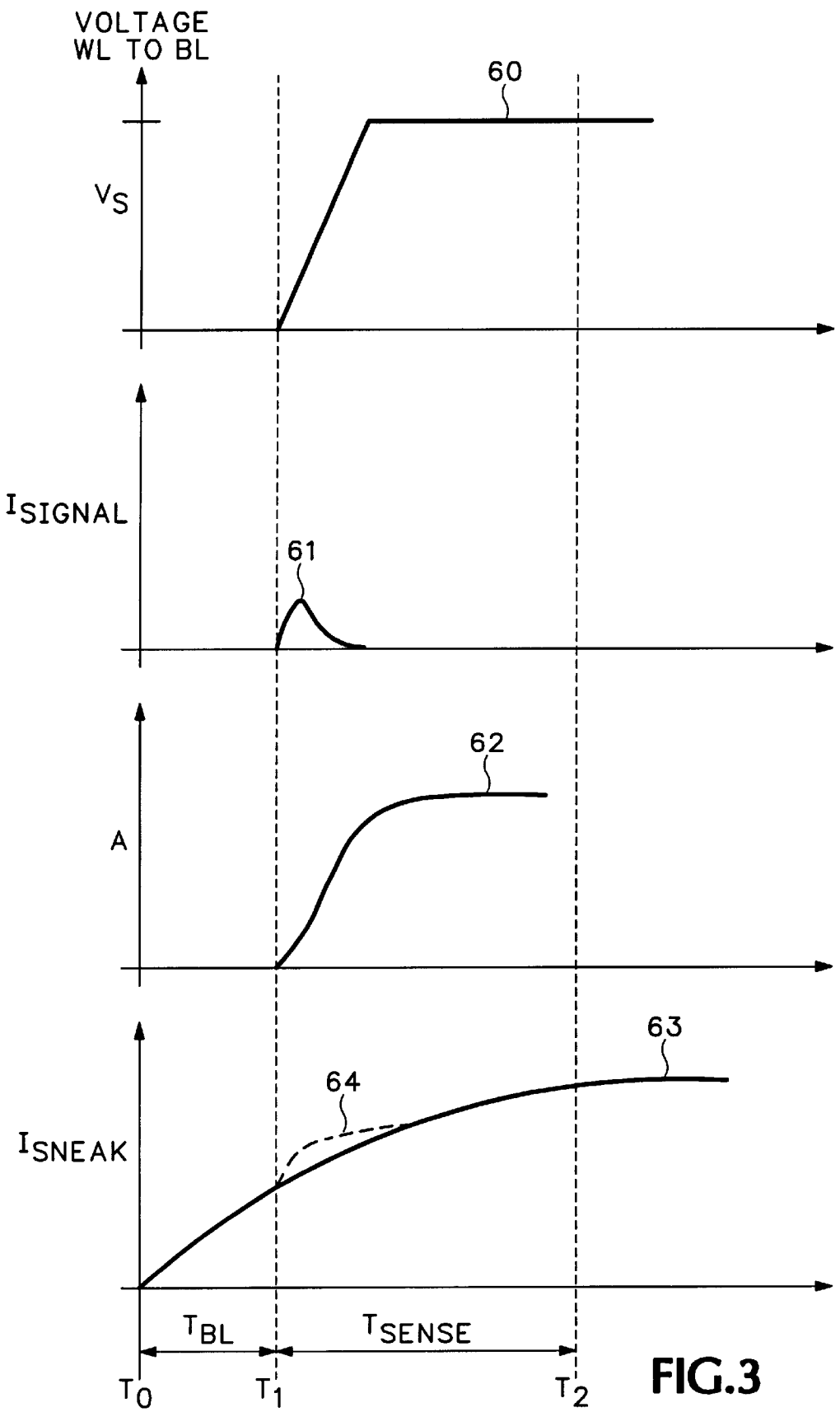
FIG. 3 is a timing diagram for illustrating sneak charge in a ferroelectric memory device.

FIG. 3 illustrates simplistically and ideally an exemplary method of reading a ferroelectric memory cell, such as cell 10 in FIG. 1, wherein charge is released and integrated during the application of a switching level voltage to the cell. After time duration $T_{BL}$ (e.g., a bit line settling time as will be described below), the word line is activated by applying a switching level voltage Vs to the word line 20 relative to the bit line 22, which is driven to zero volts. Through duration $T_{sense}$, the active cell, if it is in the logic "one" state (i.e., negative polarization), releases polarization reversal charge in the form of a signal current $I_{signal}$ shown as curve 61 through the bit line.

Because this signal charge is typically very small, the signal current is integrated using an integrating sense amplifier so as to extract all of the signal released from the memory element over the full duration of release. Thus, the integrating sense amplifier generates the integrated output signal A shown as curve 62. If the cell was in the logic "zero" state (i.e., positive polarization), little or no charge is released, the signal current is essentially zero, and thus, the integrated output signal A remains at zero.

Referring to FIG. 2, however, active bit line 22 is coupled not only to active cell 10, but also to other passive cells where it crosses the passive word lines. Likewise, active word line 20 is also coupled to passive cells associated with the passive bit lines. To prevent corruption of the data stored in the passive cells during a read operation, the passive word lines are driven with a passive word line biasing of Vs/3, and the passive bit lines are driven with a passive bit line biasing of 2Vs/3 at time To in FIG. 3. Thus, none of the passive cells experiences a differential voltage greater than the quiescent voltage Vs/3 (also referred to as a disturb voltage), and, due to the resilient qualities of the ferroelectric cell, the polarization of the passive cells is not reversed.

However, although the quiescent bias of Vs/3 on the passive cells coupled to bit line 22 in FIG. 2 is not enough to reverse the cell polarization, it causes the passive cells to release "sneak charge" in the form of a sneak current $I_{sneak}$ shown (not to scale) as curve 63 in FIG. 3. The sneak charge form a single passive cell is typically much smaller than the polarization reversal charge of an active cell. In a practical implementation, however, the active bit line is typically coupled to thousands of passive cells in addition to the one active cell. Thus, the sneak current from the passive cells on the bit line overwhelms the actual signal current (shown summed with the sneak current as dashed curve 64) from the active cell. In a practical implementation, the magnitude of the sneak current can be hundreds of times that of the signal current. Although collectively much larger than the signal current, the sneak current increases at a slower rate (typically modeled as a 50 μs time constant) than the signal current which has a much shorter rise time.

Figure 4:
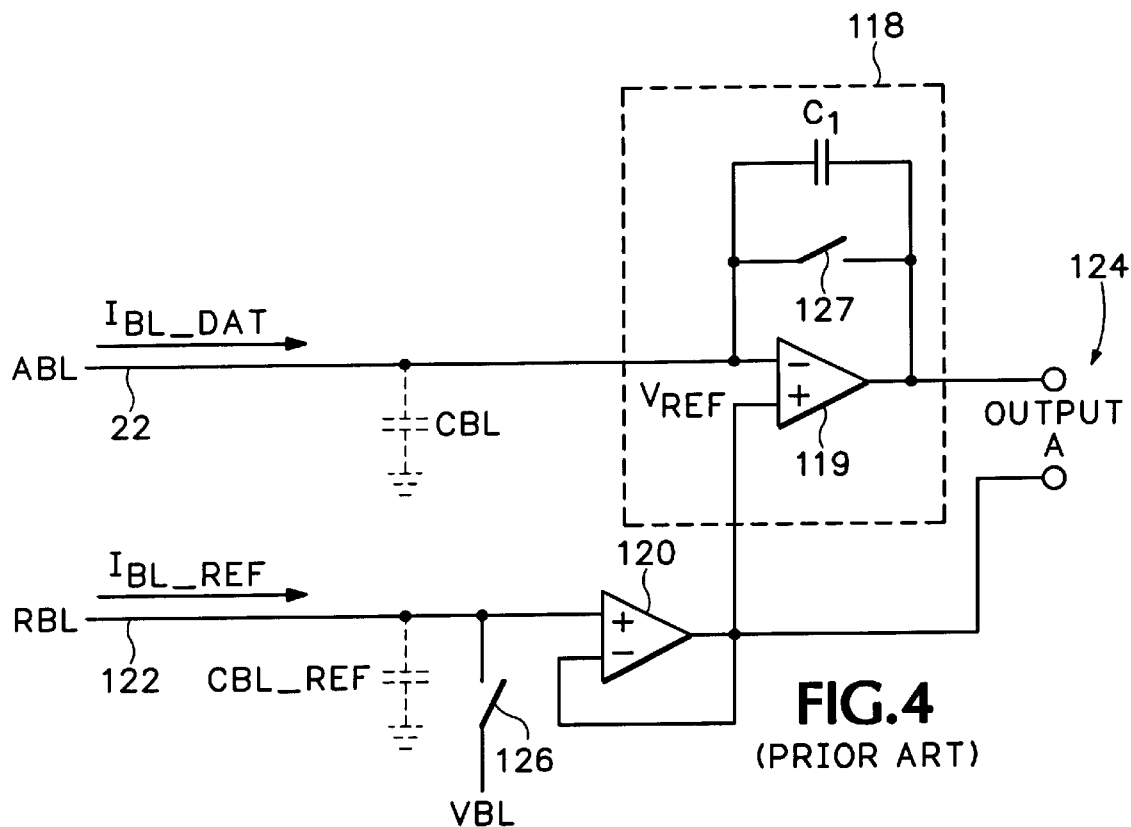
FIG. 4 is a schematic diagram of a prior art sense amplifier arrangement for reading a ferroelectric cell.

To distinguish the actual signal charge and current from the sneak charge and current, a sense amp arrangement such as that shown in FIG. 4 can be used to subtract an (ideally) equal sneak current obtained from a reference bit line RBL from the sneak current from the active bit line ABL, thereby integrating only the actual signal current. The sense amp circuit of FIG. 4 includes an integrating amplifier 118 comprised of an operational amplifier (op amp) 119 arranged as an integrator with capacitor $C_1$ and reset switch 127 in its feedback network. The inverting input of the op amp is coupled to the active bit line ABL, typically through a multiplexer (not shown), to receive the current $I_{BL\_DAT}$, which includes a signal current component and a sneak current component.

The noninverting input of the op amp is coupled to the output of a reference amplifier 120 which is arranged as a voltage follower and coupled to a reference bit line RBL to receive the current $I_{BL\_REF}$ which is ideally a replica of the sneak current released by the active bit line. The active and reference bit lines have parasitic capacitances shown as $C_{BL}$ and $C_{BL\_REF}$, respectively. A switch 126 is coupled between the reference bit line and a recharge power supply $V_{BL}$.

The operation of the sense amp circuit of FIG. 4 will now be described with reference to FIGS. 2, 3 and 4. Prior to time $T_0$, reset switch 127 is closed to prevent capacitor $C_1$ from charging, and the word lines and bit lines are all biased at the voltage level Vs/3. At time $T_0$, the voltage level of the passive bit lines is increased to $2V_s/3$, and switch 126 is closed to precharge the reference bit line to $V_{BL}$ (in this case, 0 volts). This also maintains the active bit line at $V_{BL}$ due to the virtual short circuit between the noninverting (+) and inverting (–) terminals of the amplifier 118. Alternatively, the active bit line may be held at $V_{BL}$ through other techniques, as would be necessary for example, if the circuit of FIG. 4 did not include the reference bit line.

At these levels, the ferroelectric cells between the word lines and active bit line experience a voltage potential of $V_s/3$. This causes any passive cells in the "one" state along the active bit line to release a residual amount of sneak charge to provide a sneak current (curve 63 in FIG. 3) to the active bit line. Bit line settling duration $T_{BL}$ between times $T_0$ and $T_1$ allows the sneak current to stabilize before trying to determine the state of the active cell.

At time $T_1$, switch 126 is opened, and the active word line is driven with the active word line biasing $V_s$ as depicted by waveform 60 at time $T_1$. Since the active bit line remains at the active bit line biasing of 0 volts, the active ferroelectric cell located at the intersection of the active word line and active bit line receives the full read voltage potential sufficient for switching its polarization state. If the active cell is in the "one" state, a substantial signal charge (curve 61 in FIG. 3) is release to the active bit line. Alternatively, if the active cell is in the "zero" state, only a nominal amount of charge would propagate to the active bit line.

Also at time $T_1$, switch 127 is opened to allow the sense amplifier to begin integrating the current $I_{BL\_DAT}$ from the active bit line. Because the sense amplifier is connected directly to the active bit line, the full charge released from the active memory cell (as well as any remnant sneak charge after subtracting the signal from the reference bit line) is allowed to accumulate in the feedback capacitor $C_1$. All of this charge minus any leakage current in the parasitic devices is collected in capacitor $C_1$ giving rise to a voltage variation in the output signal A that is proportional to the amount of signal charge released from the active bit line and inversely proportional to the capacitance of $C_1$.

Figure 5:
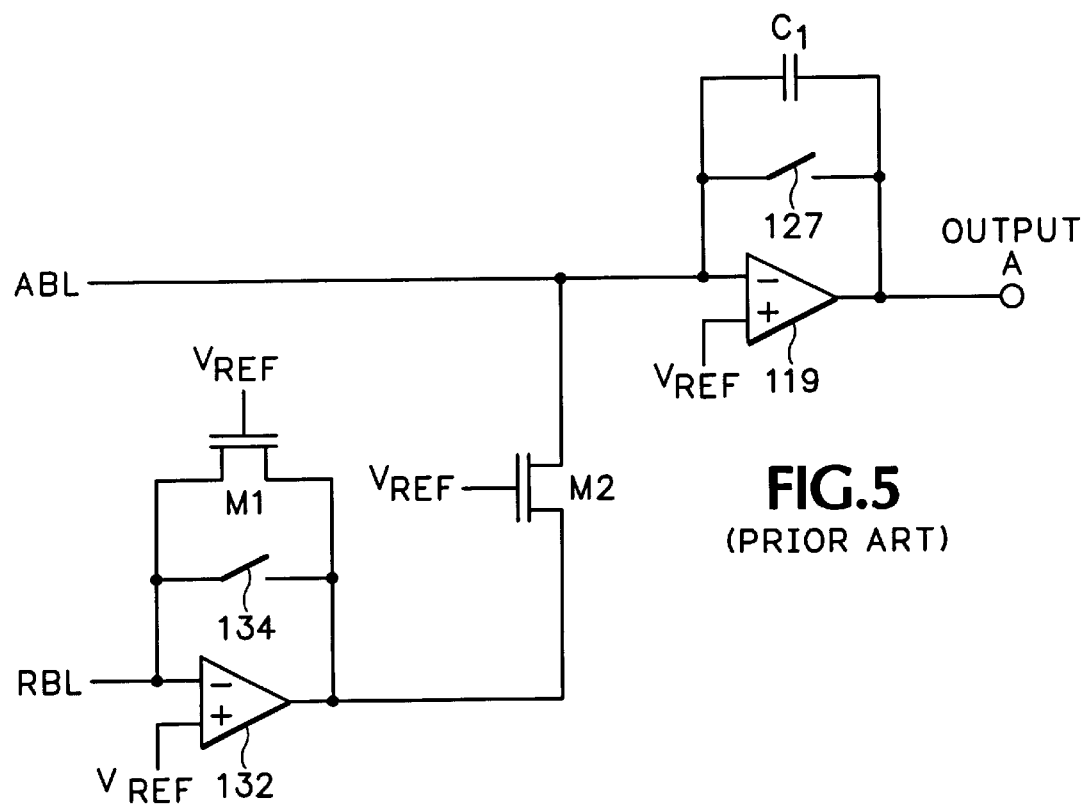
FIG. 5 is a schematic diagram of another prior art sense amplifier arrangement for reading a ferroelectric cell.

FIG. 5 illustrates another prior art circuit for distinguishing the actual signal charge and current from the sneak charge and current. The circuit of FIG. 5 includes an integrating sense amplifier 118 as well as a reference circuit 130 connected to a reference bitline RBL. The reference circuit includes a reference amplifier 132, in this case an operational amplifier, with a MOSFET (metal oxide semiconductor field effect transistor) M1 having its channel connected in the feedback path of the reference amplifier. A reset switch 134 is connected in parallel with transistor M1, and the output of the reference amp at node N1 is connected to the active bit line through the channel of another MOSFET M2. The gates of both M1 and M2 are connected to a reference voltage $V_{REF}$.

As with the circuit of FIG. 4, the circuit of FIG. 5 performs sneak current cancellation, but here the reference circuit is coupled to the sense amp through a direct connection to the active (data) bit line so that the sneak current is subtracted directly from the data bit line, rather than through a separate input to the sense amplifier. In this configuration, the sneak charge from the reference bit line flows through transistor M1. This causes the output of the reference amp to generate a cancellation signal at node N1. The cancellation signal is connected to the source of transistor M2 which, due to its mirror configuration with M1, causes current to be subtracted from the data bit line in proportion to the amount of current flowing through M1. By ratioing the geometry of transistors M1 and M2, it is possible to remove a desired fraction of the sneak current seen in the reference bit line from the data bit line.

The current through a MOSFET device follows a square-law behavior with respect to the gate-to-source voltage; that is, the drain current $I_D$ varies as $(V_{GS}-V_t)^2$ where $V_{GS}$ is the gate-to-source voltage, and $V_t$ is the threshold voltage. Thus, a linear output voltage swing in the reference amplifier translates to a non-linear variation in the currents through M1 and M2.

A primary disadvantage of the circuit shown in FIG. 5 lies in the matching requirements of the devices M1 and M2. In a practical implementation, the circuit would typically not be designed to cancel all of the sneak current because mismatches in M1 and M2, as well as other device tolerances might actually result in a negative signal current being integrated by the sense amp 118. It is therefore usually necessary to budget for the anticipated mismatch between the devices in the design. A circuit such as that shown in FIG. 5 is typically designed to cancel about 80 or 90 percent of the sneak current. The margin allowed for the mismatch in M1 and M2 directly subtracts from the fraction of the reference sneak current that can be subtracted from the data bit line current. This, in turn, reduces the effectiveness of the sneak current cancellation, thereby reducing the sensitivity of the data bit line sensing operation.

An additional problem with the circuit of FIG. 5 is that the maximum output voltage swing of the reference amp is reduced by the threshold voltage $V_t$ of M1 because output of the reference amp has to drop by at least $V_t$ in order for reference sneak current to begin flowing through the device.

Yet another disadvantage of the circuit of FIG. 5 relates to the operating stability of the circuit. Since the square-law behavior of M1 causes any variation in the output voltage of the reference amplifier to translate to a correspondingly greater variation in the current through the feedback device M1, this configuration may require additional compensation for output stability. An excessive fall in the output voltage leads to current flow through M1 that is larger than the sneak current flowing into the reference line, thereby creating a drop in potential at the (−) input to the reference amplifier. This drives the output off the reference amplifier back up, and the input to output delay in the amplifier may lead to the output rising more then required, thus cutting of device M1.

Figure 6:
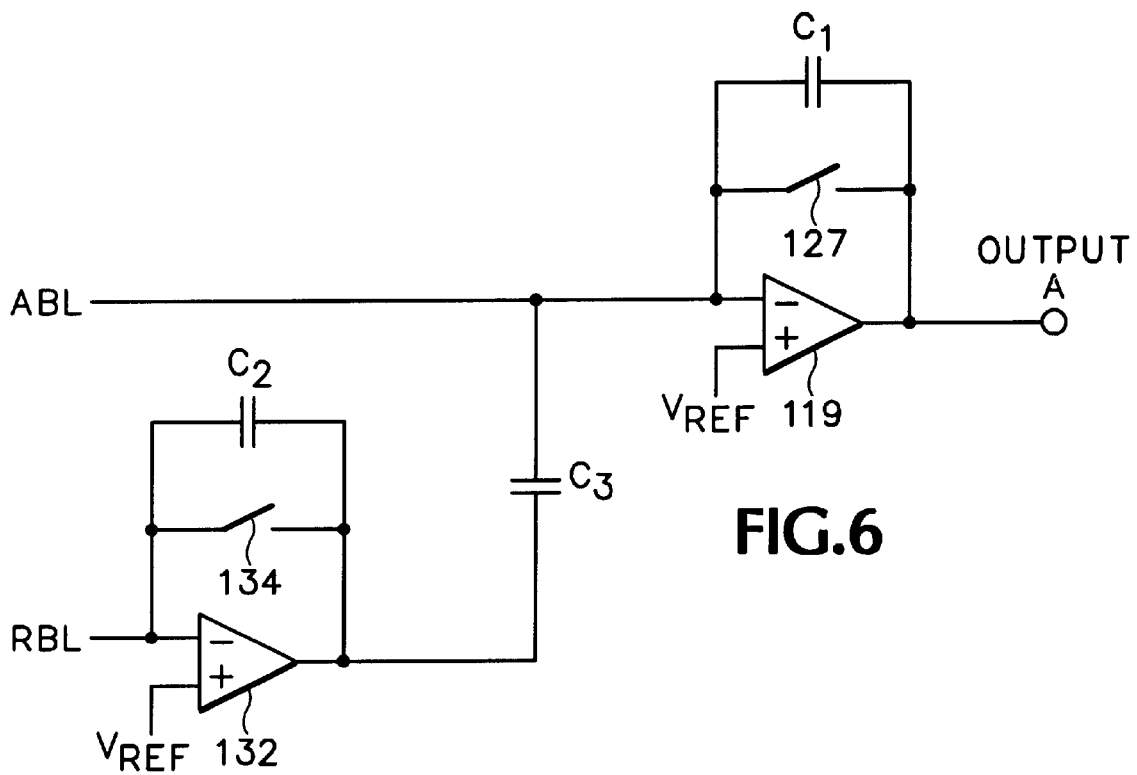
FIG. 6 is a schematic diagram of an embodiment of a sense amplifier arrangement for a ferroelectric memory device in accordance with the present invention.

One aspect of the present invention involves the use of capacitive coupling between a reference circuit and a sense amp. FIG. 6 is a schematic diagram of an embodiment of a sense amplifier arrangement for a ferroelectric memory device in accordance with the present invention. The embodiment of FIG. 6 includes an integrating amplifier 118 based on an operational amplifier 119 having a feedback capacitor $C_1$ and reset switch 127 connected between its output and inverting (−) input. The noninverting (+) input of the op amp is coupled to receive a reference signal $V_{REF}$ which maintains the (−) input at a virtual ground.

The embodiment of FIG. 6 also includes reference circuit having a reference amplifier 132, which in this embodiment is an operational amplifier. The reference amplifier is configured as an integrator with a feedback capacitor $C_2$ and reset switch 134 connected in parallel between its (−) input and output terminal at node N1. The (−) input of the reference amp is connected to the reference bit line RBL, while its (+) input is tied to a reference voltage $V_{REF}$. The reference amplifier generates a cancellation signal $V_{CAN}$ at its output by integrating sneak current received from the reference bit line using capacitor $C_2$.

Rather than coupling the cancellation signal to the sense amp through a MOSFET, however, the cancellation signal from the reference circuit is coupled to the sense amp through a capacitor. In the embodiment of FIG. 6, this is accomplished by coupling the cancellation signal to the active (data) bit line through capacitor $C_3$. Thus, a certain fraction of the sneak charge from the reference bit line is removed directly from the data bit line. The ratio of the capacitances of $C_2$ and $C_3$ determines the fraction of sneak charge removed.

An advantage of this aspect of the present invention is that the capacitances of $C_1$ and $C_2$ can be matched more accurately than the transistors M1 and M2 in the circuit if FIG. 5. Therefore, the anticipated mismatch is reduced, so the circuit can be designed to remove a greater fraction of sneak charge from the data bit line. This, in turn allows for higher gain in the sense amp circuitry, thereby enabling the sensing of smaller signals out of the memory cells.

An additional benefit is that the capacitors do not have a threshold voltage limitation as do the transistors M1 and M2 of FIG. 5. This allows for a greater output voltage swing for the reference amplifier.

Another aspect of the present invention involves the use of linear-responding components to stabilize the operation of a sneak current canceling sense amp arrangement. This aspect of the present invention can be realized using the embodiment shown in FIG. 6 because the capacitors $C_2$ and $C_3$ are linear-responding components. This aspect of the present invention, however, is not limited to capacitors. The linear variation in current with changes in amplifier output improves circuit stability and reduces susceptibility to noise.

Having described and illustrated the principles of the invention, it should be apparent that the invention can be modified in arrangement and detail without departing from such principles. Accordingly, such changes and modifications are considered to fall within the scope of the following claims.

What is claimed is:

1. A memory device comprising:
   a bit line coupled to a ferroelectric memory cell;
   a sense amplifier coupled to the bit line;
   a reference circuit; and
   a capacitor coupled between the reference circuit and the sense amplifier.

2. The memory device according to claim 1 wherein the bit line is a data bit line, and the reference circuit is constructed and arranged to cancel sneak charge from the data bit line responsive to sneak charge from a reference bit line.

3. The memory device according to claim 2 wherein the capacitor is a first capacitor, and the reference circuit comprises a second capacitor arranged so that the amount of sneak charge canceled from the data bit line depends on the relative capacitances of the first and second capacitors.

4. The memory device according to claim 1 wherein the capacitor has a first terminal coupled to the reference circuit and a second terminal coupled to the bit line.

5. A memory device comprising:
   a bit line coupled to a ferroelectric memory cell;
   a sense amplifier coupled to the bit line;
   a reference circuit; and
   a capacitor coupled between the reference circuit and the sense amplifier;
   wherein the bit line is a data bit line, and the reference circuit comprises a reference amplifier coupled to a reference bit line.

6. The memory device according to claim 5 wherein the capacitor is a first capacitor and the reference circuit comprises a second capacitor coupled to the reference amplifier.

7. The memory device according to claim 6 wherein the reference amplifier comprises an operational amplifier having an input coupled to the reference bit line and the first terminal of the second capacitor and an output coupled to the second terminal of the second capacitor and the first terminal of the first capacitor.

8. The memory device according to claim 7 wherein the second terminal of the first capacitor is coupled to the data bit line.

9. A memory device comprising:
   a data bit line coupled to a ferroelectric memory cell;
   a sense amplifier coupled to the data bit line;
   a reference bit line;
   a reference amplifier coupled to the reference bit line;
   a first linear-responding component coupled between the data bit line and the reference amplifier; and
   a second linear-responding component coupled between the reference bit line and the first linear-responding component.

10. The memory device according to claim 9 wherein the reference amplifier comprises an operational amplifier having an input coupled to the reference bit line and the first terminal of the second linear-responding component, and an output coupled to the second terminal of the second linear-responding component and the first terminal of the first linear-responding component.

11. The memory device according to claim 9 wherein the first and second linear-responding components are capacitors.

12. A memory device comprising:
    a data bit line coupled to a ferroelectric memory cell;
    a sense amplifier coupled to the data bit line;
    means for integrating sneak charge from a reference bit line; and
    means for canceling sneak charge from the data bit line responsive to the amount of sneak charge from the reference bit line.

13. The memory device according to claim 12 wherein the means for integrating and the means for canceling are constructed and arranged such that the amount of sneak charge canceled from the data bit line is proportional to the amount of sneak charge integrated from the reference bit line.

14. The memory device according to claim 12 wherein:
    the means for integrating sneak charge from the reference bit line comprises a first capacitor; and
    the means for canceling sneak charge from the data bit line comprises a second capacitor.

15. The memory device according to claim 14 wherein the first and second capacitors are arranged so that the amount of sneak charge canceled from the data bit line depends on the relative capacitances of the first and second capacitors.

16. The memory device according to claim 14 wherein the first and second capacitors are coupled together at a node, and further comprising means for driving the node responsive to the reference bit line.

17. The memory device according to claim 12 wherein:
    the means for integrating sneak charge from the reference bit line comprises a first linear-responding component; and
    the means for canceling sneak charge from the data bit line comprises a second linear-responding component.

18. A method for sensing a ferroelectric cell coupled to a data bit line comprising:
    generating a cancellation signal responsive to a reference bit line;
    sensing the data bit line with a sense amplifier; and
    coupling the cancellation signal to sense amplifier through a capacitor.

19. The method according to claim 18 wherein coupling the cancellation signal to the sense amplifier through a capacitor comprises coupling the cancellation signal to the data bit line through a capacitor.

20. The method according to claim 19 wherein coupling the cancellation signal to the data bit line through a capacitor comprises removing sneak current from the data bit line.

21. The method according to claim 19 wherein generating the cancellation signal responsive to the reference bit line comprises integrating current received from the reference bit line with a second capacitor.

22. The method according to claim 21 further comprising driving the first and second capacitors so as to remove sneak current from the data bit line in proportion to the relative capacitances of the first and second capacitors.

* * * * *